United States Patent
Liu et al.

(10) Patent No.: US 12,185,519 B2
(45) Date of Patent: Dec. 31, 2024

(54) MEMORY DEVICE CAPACITOR CONTACT STRUCTURE AND METHOD FOR PREPARING SAME

(71) Applicant: CHANGXIN MEMORY TECHNOLOGIES, INC., Anhui (CN)

(72) Inventors: Zhongming Liu, Hefei (CN); Shijie Bai, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 208 days.

(21) Appl. No.: 17/445,964

(22) Filed: Aug. 26, 2021

(65) Prior Publication Data
US 2022/0310623 A1    Sep. 29, 2022

Related U.S. Application Data

(63) Continuation of application No. PCT/CN2021/104136, filed on Jul. 2, 2021.

(30) Foreign Application Priority Data

Mar. 24, 2021  (CN) .......................... 202110312112.0

(51) Int. Cl.
  *H10B 12/00*  (2023.01)
(52) U.S. Cl.
  CPC ....... *H10B 12/0335* (2023.02); *H10B 12/053* (2023.02); *H10B 12/315* (2023.02); *H10B 12/34* (2023.02); *H10B 12/485* (2023.02)
(58) Field of Classification Search
  CPC .............. H10B 12/0335; H10B 12/053; H10B 12/315; H10B 12/34; H10B 12/485; H10B 51/00
  See application file for complete search history.

(56) References Cited

U.S. PATENT DOCUMENTS

| 6,720,256 B1 * | 4/2004 | Wu ................... H01L 21/76808 438/638 |
| 10,388,564 B2 | 8/2019 | Wu et al. |

(Continued)

FOREIGN PATENT DOCUMENTS

| CN | 101937877 A | 1/2011 |
| CN | 107342263 A | 11/2017 |

(Continued)

OTHER PUBLICATIONS

First Office Action of the Chinese application No. 202110312112.0, issued on Mar. 7, 2022.

*Primary Examiner* — Meiya Li
(74) *Attorney, Agent, or Firm* — Syncoda LLC; Feng Ma

(57) ABSTRACT

A method for preparing a capacitor contact structure of a memory device includes providing a substrate, forming a plurality of bit line structures arranged in parallel and at intervals on the substrate, and the bit line structures extending along a first direction; forming conducting layer structures between adjacent bit line structures, upper surfaces of which are lower than upper surfaces of the bit line structures; forming sacrificial layers on the conducting layer structures; forming a plurality of isolation trenches arranged in parallel and at intervals in the sacrificial layer, the isolation trenches extend along a second direction, and the second direction intersects the first direction; forming isolation dielectric layers in the isolation trenches; and removing the sacrificial layer based on the bit line structure and the isolation dielectric layer to form grooves between adjacent bit line structures and between adjacent isolation dielectric layers, the grooves expose the conducting layer structures.

16 Claims, 20 Drawing Sheets

(56) References Cited

U.S. PATENT DOCUMENTS

2008/0303075 A1* 12/2008 Setokubo ............ H01L 21/7621
                                                                                   257/E21.546
2019/0312037 A1    10/2019  Chang et al.
2021/0327714 A1* 10/2021  Lee ....................... H01L 21/302

FOREIGN PATENT DOCUMENTS

| CN | 107546226 | A | * | 1/2018 |
| CN | 109216466 | A | | 1/2019 |
| CN | 110970351 | A | | 4/2020 |
| CN | 112951769 | A | | 6/2021 |
| CN | 112992905 | A | | 6/2021 |
| JP | 2008235339 | A | | 10/2008 |

* cited by examiner

First direction

Second direction

First direction

MEMORY DEVICE CAPACITOR CONTACT STRUCTURE AND METHOD FOR PREPARING SAME

CROSS-REFERENCE TO RELATED APPLICATIONS

This application is a continuation of International Application No. PCT/CN2021/104136 filed on Jul. 2, 2021, which claims priority to Chinese Patent Application No. 202110312112.0, filed on Mar. 24, 2021. The disclosures of these applications are hereby incorporated by reference in their entirety.

BACKGROUND

In a manufacturing process of a typical semiconductor memory device, the steps of forming a capacitor contact structure includes the steps as follows. First step, spin-on dielectric (SOD) is filled as a sacrificial layer structure between bit line structures. Second step, a plurality of isolation trenches are formed after partial SOD is etched and removed in a direction perpendicular to the bit line structure. Third step, backfill is performed in the isolation trench to form an inverted trapezoidal silicon nitride (SIN) isolation structure. Fourth step, after the remaining SOD sacrificial layer structure is removed by performing an etching process, a contact hole surrounded by the SIN isolation structure and the bit line structure is obtained; and a structure at a bottom of the contact hole is removed by etching so as to expose an active region at the bottom of the contact hole. Fifth step, a polysilicon structure in contact with the active region at the bottom of the contact hole is filled in the contact hole as a capacitor contact structure. However, the SIN isolation structure in the direction of the isolation trench is an inverted trapezoid, and the bit line structure is a regular trapezoid, so the polysilicon structure as the capacitor contact structure is a regular trapezoid along the direction of the bit line structure, and an inverted trapezoid along the direction of the SIN isolation structure. Gaps are easily formed in the polysilicon structure, which will affect the contact between the capacitor structure formed above the polysilicon structure and the active region.

SUMMARY

The present disclosure relates generally to the technical field of semiconductors, and more specifically to a memory device capacitor contact structure and a method for preparing the same.

The disclosure provides a method for preparing a capacitor contact structure of a memory device. The method includes the following operations.

A substrate is provided, in which a plurality of bit line structures arranged in parallel and at intervals are formed on the substrate, and the bit line structures extend along a first direction.

Conducting layer structures are formed between adjacent bit line structures, in which upper surfaces of the conducting layer structures are lower than upper surfaces of the bit line structures.

Sacrificial layers are formed on the conducting layer structures.

A plurality of isolation trenches arranged in parallel and at intervals are formed in the sacrificial layer, the isolation trenches extend along a second direction, and the second direction intersects the first direction.

Isolation dielectric layers are formed in the isolation trenches.

The sacrificial layers are removed based on the bit line structures and the isolation dielectric layers, grooves are formed between adjacent bit line structures and between adjacent isolation dielectric layers, in which the grooves expose the conducting layer structures.

The disclosure further provides a capacitor contact structure of a memory device, which is prepared by the above-mentioned preparation method.

BRIEF DESCRIPTION OF THE DRAWINGS

To better clarity the technical solution of the embodiments of the present disclosure or the traditional technology, the drawings required to illustrate the embodiments or the traditional technology will be simply described blow. It is apparent that the drawings described below merely illustrate some embodiments of the present disclosure. Those ordinarily skilled in the art can obtain other drawings without creative labor on the basis of those drawings.

NUMERAL REFERENCES

Figure 1:
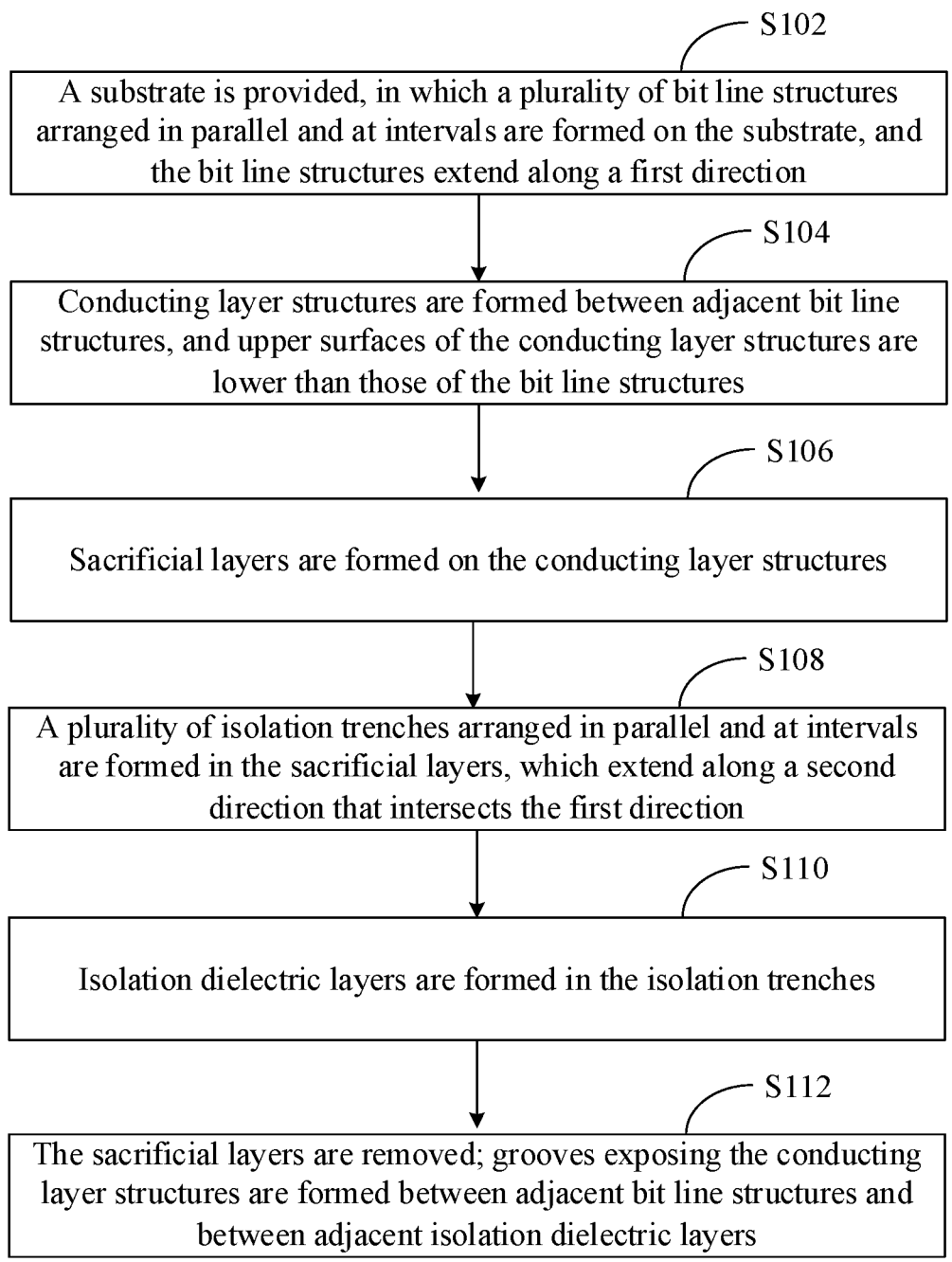
FIG. 1 is a flow schematic diagram of a preparation method for a memory device capacitor contact structure according to an embodiment.

100: substrate; 102: shallow trench isolation structure; 104: active region; 106: embedded gate word line; 108: insulating layer; 200: bit line structure; 202: stacked structure; 204: sidewall structure; 204a: inner silicon nitride layer; 204b: middle silicon oxide layer; 204c: outer silicon nitride layer; 206: main conducting layer; 206a, 206b: sublayers of main conducting layer; 208: top dielectric layer; 300: conducting layer structure; 302: conducting material layer; 400: sacrificial layer; 500: isolation trench; 600: isolation dielectric layer; 602: first silicon nitride layer; 604: first silicon oxide layer; 606: second silicon nitride layer; 700: groove; H1: height of top dielectric layer; D1: depth of isolation trench; D1': depth of isolation trench located directly above bit line structure; S1: thickness of conducting layer; S2: thickness of sacrificial layer.

DETAILED DESCRIPTION

In order to make the present disclosure convenient to understand, the present disclosure will be described more comprehensively below with reference to the related drawings. The drawings show preferred embodiments of the present disclosure. However, the present disclosure may be implemented in various forms and is not limited to the embodiments described herein. Instead, these embodiments are provided to make the contents disclosed in the present disclosure understood more thoroughly and comprehensively.

Unless otherwise defined, all technical and scientific terms used herein have the same meanings as commonly understood by those skilled in the art that the present disclosure belongs to. Herein, terms used in the description of the present disclosure are only for the purpose of describing specific embodiments and not intended to limit the present disclosure.

It should be understood that description that an element or layer is "on", "adjacent to", "connected to", or "coupled to" another element or layer may refer to that the element or layer is directly on, adjacent to, connected to or coupled to the other element or layer, or there may be an intermediate element or layer. On the contrary, description that an element is "directly on", "directly adjacent to" or "directly connected to" or "directly coupled to" another element or layer refers to that there is no intermediate element or layer. It should be understood that, although various elements, components, regions, layers, doped types and/or parts may be described with terms first, second, third, etc., these elements, components, regions, layers, doped types and/or parts should not be limited to these terms. These terms are used only to distinguish one element, component, region, layer, doped layer or part from another element, component, region, layer, doped type or part. Therefore, a first element, component, region, layer, doped type or part discussed below may be represented as a second element, component, region, layer or part without departing from the teaching of the present disclosure. For example, a first doped type may become a second doped type, and similarly a second doped type may become a first doped type. The first doped type and the second doped type are different doped types. For example, the first doped type may be type-P and the second doped type may be type-N, or the first doped type may be type-N and the second doped type may be type-P.

Spatially relational terms such as "below", "under", "lower", "beneath", "above", and "upper" may be used herein to describe a relationship between one element or feature and another element or feature illustrated in the figures. It should be understood that, in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

As used herein, singular forms "a/an", "one", and "the" may also include the plural forms, unless otherwise specified in the context. It should be also understood that, when terms "composed of" and/or "including" are used in this description, the presence of the features, integers, steps, operations, elements, and/or components is determined, but the presence or addition of one or more other features, integers, steps, operations, elements, components, and/or groups is also possible. As used herein, term "and/or" includes any and all combinations of the related listed items.

Embodiments of the present disclosure are described with reference to a section diagram of a schematic diagram of a perfect embodiment (and a middle structure) of the present disclosure, thus predicting a change of a shown shape caused by, such as a manufacturing technology and/or tolerance. Therefore, the embodiments of the present disclosure should not be limited to a specific shape of a region herein, but include a shape deviation caused by the manufacturing technology. For example, an injection region shown as a rectangle usually has a circular or bending feature and/or an injection concentration gradient at an edge of the injection region instead of a binary change from the injection region to a non-injection region. Similarly, a burying region formed through injection may cause some injections in the burying region and a region among passing surfaces when performing the injection. Therefore, the regions shown in the figures are essentially schematic, their shapes do not show actual shapes of the regions of device, and the scope of the present disclosure is not limited.

A typical preparation method for a semiconductor memory device is to first form a capacitor contact hole surrounded by silicon nitride exposing an active region, and then form a capacitor contact structure after the capacitor contact hole is filled with a conducting medium. The capacitor contact structure in the direction along a bit line structure is a regular trapezoid and an inverted trapezoid in the direction along an SIN isolation structure. A gap is easily formed in the capacitor contact structure, which affects the contact between a capacitor structure formed above the capacitor contact structure and the active region.

Referring to FIG. 1, which is a flow schematic diagram of a preparation method for a memory device capacitor contact structure according to an embodiment.

For the abovementioned problem, the present disclosure provides a preparation method for a memory device capacitor contact structure. As shown in FIG. 1, the preparation method includes the following operation.

At S102, a substrate is provided, in which a plurality of bit line structures arranged in parallel and at intervals are formed on the substrate, and the bit line structures extend along a first direction.

The substrate can be un-doped monocrystalline silicone, monocrystalline silicone doped with impurities, silicon on insulator (SOI), superimposed silicon on insulator (SSOI), superimposed silicon germanium on insulator (SOI), Silicon germanium on insulator (SiGeOI) and germanium on insulator (GeOI), etc. For example, in this embodiment, the composition material of the substrate is monocrystalline silicone.

At S104, conducting layer structures are formed between adjacent bit line structures, and upper surfaces of the conducting layer structures are lower than those of the bit line structures.

The trenches between the adjacent bit line structures are filled to form a conducting layer structures, the filling depth of the conducting layer structures is less than the depth of the trenches. That is, the upper surfaces of the conducting layer structures are lower than those of the bit line structures.

At S106, sacrificial layers are formed on the conducting layer structures.

The sacrificial layers are formed on the conducting layer structures by filling, and the sacrificial layers fill up the trenches between the adjacent bit line structures.

At S108, a plurality of isolation trenches arranged in parallel and at intervals are formed in the sacrificial layers, the isolation trenches extend along a second direction, and the second direction intersects the first direction.

At S110, isolation dielectric layers are formed in the isolation trenches.

At S112, the sacrificial layers are removed; grooves exposing the conducting layer structures are formed between adjacent bit line structures and between adjacent isolation dielectric layers.

The sacrificial layers are removed based on the bit line structures and the isolation dielectric layers, thus the grooves are formed between the adjacent bit line structures and between the adjacent isolation dielectric layers, and the grooves expose the conducting layer structures formed between the adjacent bit line structures.

According to the abovementioned preparation method for the memory device capacitor contact structure, the conducting layer structures are formed between adjacent bit line structures, the sacrificial layers are formed on the conducting layer structures, the plurality of isolation trenches arranged in parallel and at intervals are formed in the sacrificial layers, the isolation trenches extend along the second direction, and the second direction intersects the first direction. The isolation dielectric layers are formed in the isolation trenches. The sacrificial layers are removed based on the bit line structures and the isolation dielectric layers, the grooves are formed between the adjacent bit line structures and between the adjacent isolation dielectric layers, and the grooves expose the conducting layer structures. Herein, the conducting layer structures in contact with the active region exposed by the grooves are used as the capacitor contact structures. The capacitor contact structures in the present disclosure are a part of the conducting layer structures formed between the adjacent bit line structures. Compared with the capacitor contact structure formed by filling the contact hole directly, these capacitor contact structures have less filling difficulty, and avoid the problem that gaps are formed in the capacitor contact structure, which then affects the contact between the capacitor structure formed above the capacitor contact structure and the active region. Moreover, the sacrificial layers are formed on the conducting layer structures, when the capacitor contact structure is formed by etching, the sacrificial layers and the conducting layer structures are successively etched, so profile bowing and Si by-product caused by completely etching the conducting layer structures are reduced, and the problem of the difficulty in increasing the etching selection ratio of the conducting layer structures to the bit line structures is solved.

Figure 2:
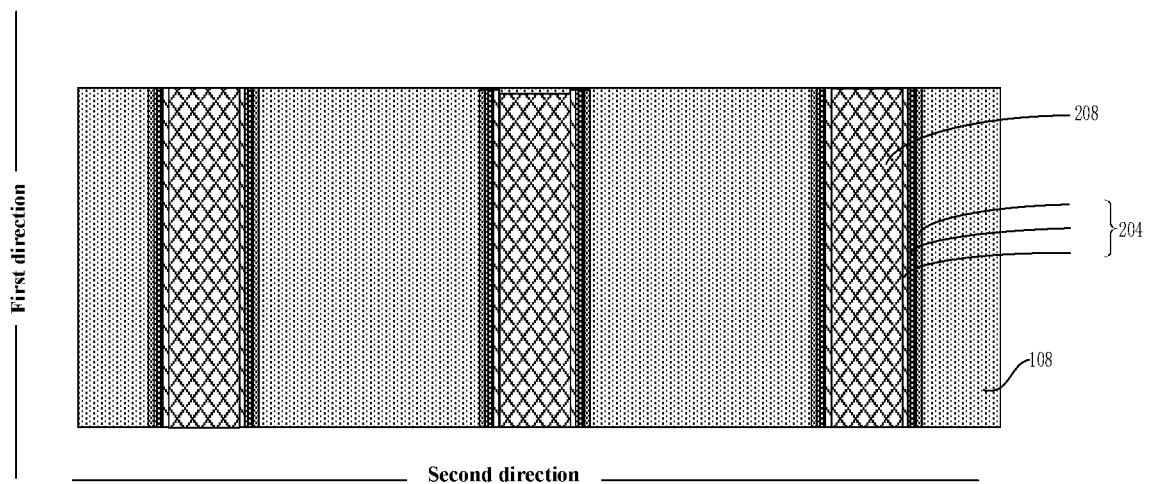
FIG. 2 is a top view schematic diagram of a memory device after forming a bit line structure according to an embodiment.
Figure 3:
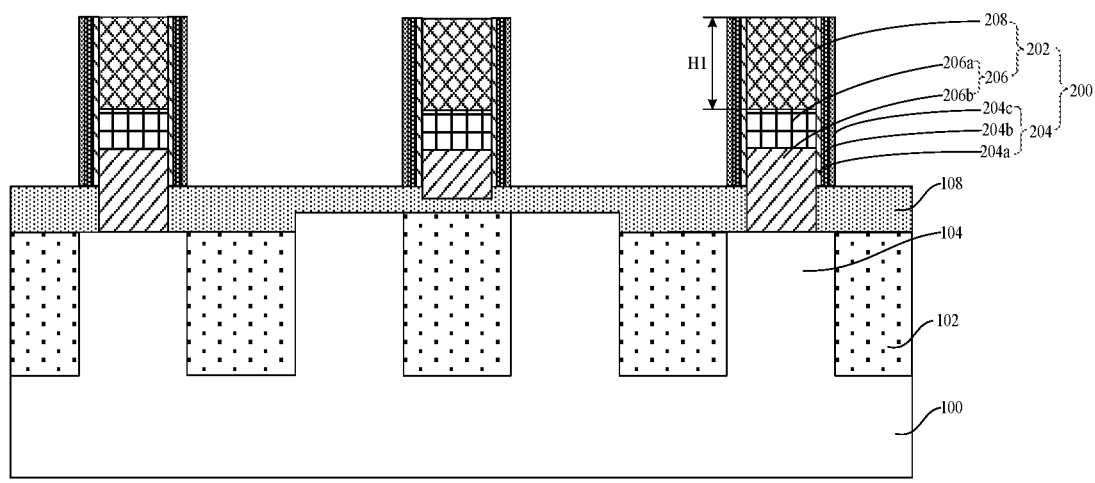
FIG. 3 is a sectional schematic diagram of a corresponding memory device in FIG. 2 along a vertical direction of a bit line structure according to an embodiment.
Figure 4:
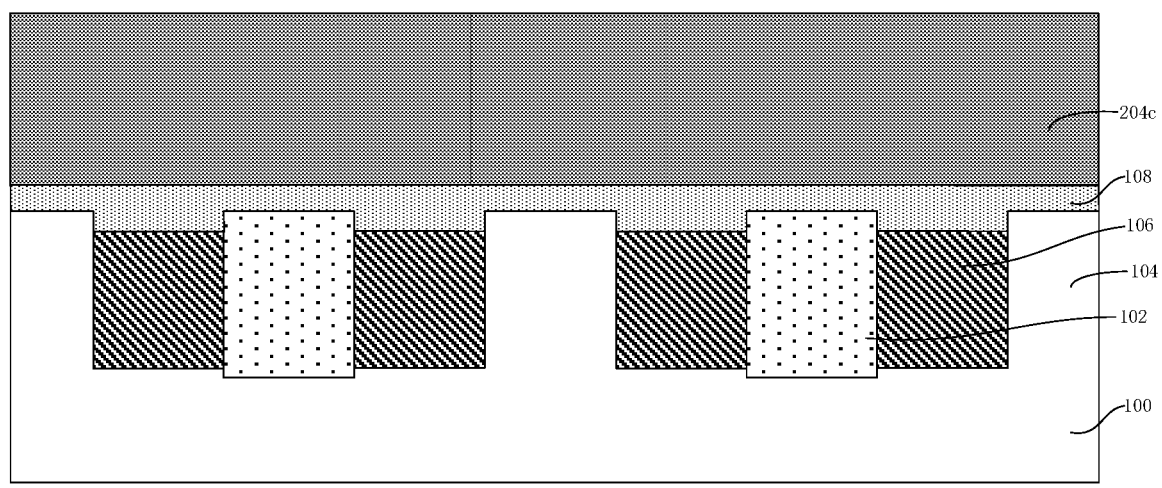
FIG. 4 is a side view of a corresponding memory device in FIG. 3 along a parallel direction of a bit line structure.

Referring to FIG. 2, which is a look-down schematic diagram of a memory device after forming a bit line structure according to an embodiment. Referring to FIG. 3, FIG. 3 is a sectional schematic diagram of a corresponding memory device in FIG. 2 along a vertical direction of a bit line structure according to an embodiment. Referring to FIG. 4, FIG. 4 is a side view of a corresponding memory device in FIG. 3 along a parallel direction of a bit line structure.

As shown in FIG. 3 and FIG. 4, the substrate 100 is provided, the plurality of bit line structures 200 arranged in parallel and at intervals are formed on the substrate 100, and the bit line structures 200 extend along the first direction.

As shown in FIG. 3 and FIG. 4, in an embodiment, shallow trench isolation structures 102 is formed in the substrate 100, and the shallow trench isolation structures 102 isolate a plurality of active regions 104 arranged at intervals in the substrate 100.

In an embodiment, a plurality of embedded gate word lines 106 arranged in parallel and at intervals are formed in the substrate 100, and the plurality of embedded gate word lines 106 extend along a second direction that intersects a first direction.

In an embodiment, the first direction intersects the second direction.

Figure 5:
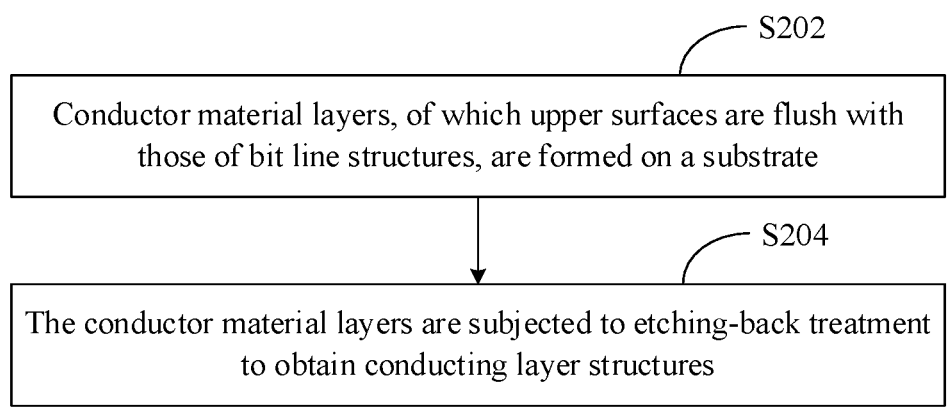
FIG. 5 is a flow schematic diagram of S104 according to an embodiment.
Figure 6:
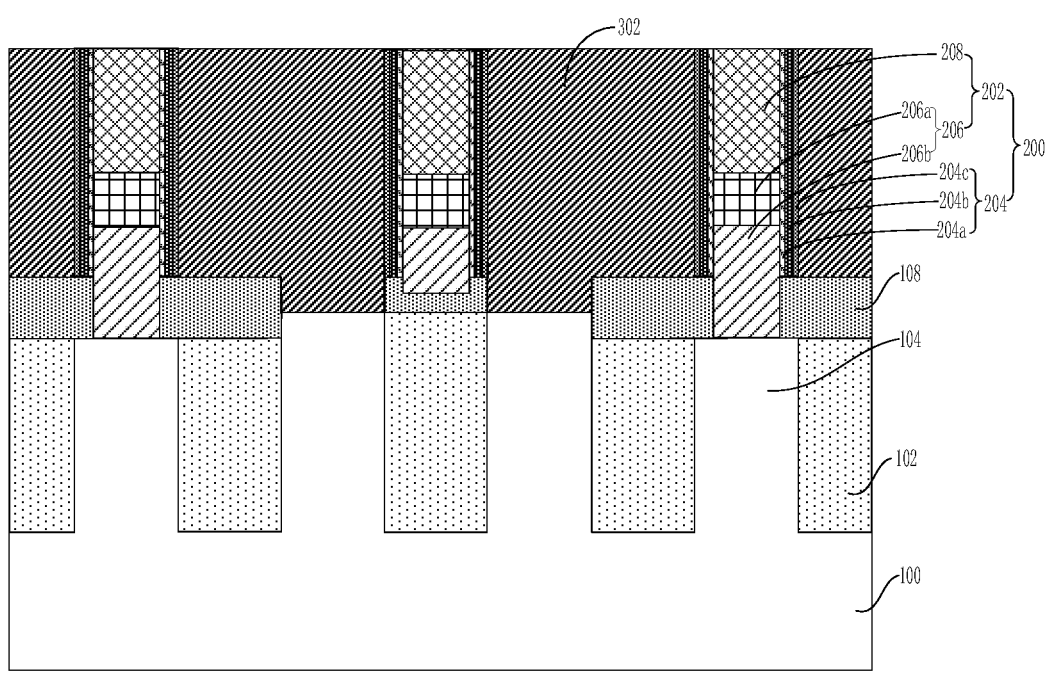
FIG. 6 is a sectional schematic diagram of a memory device along a vertical direction of a bit line structure after forming a conducting material layer according to an embodiment.
Figure 7:
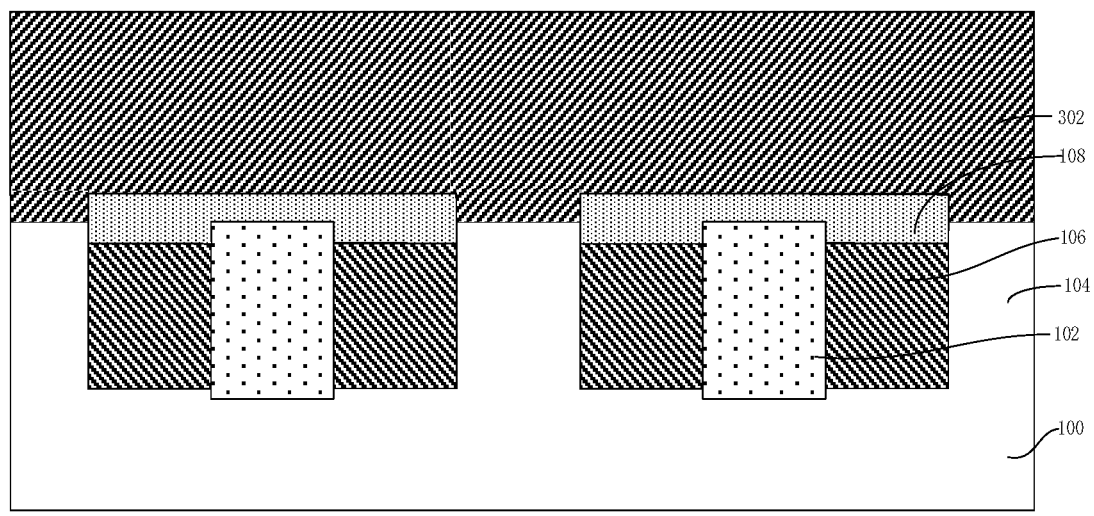
FIG. 7 is a side view of a corresponding memory device in FIG. 6 along a parallel direction of a bit line structure.
Figure 8:
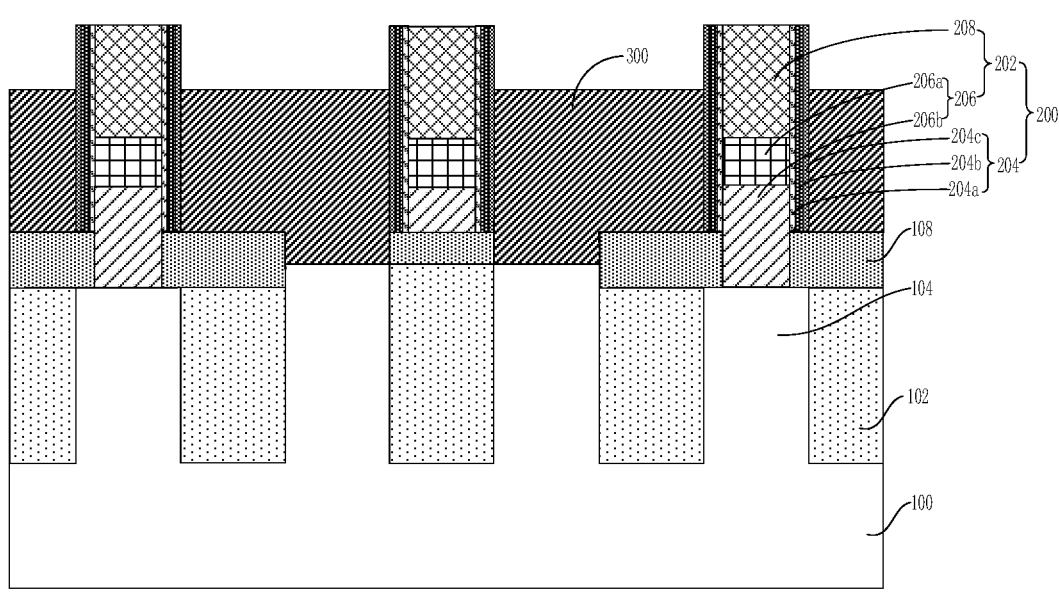
FIG. 8 is a sectional schematic diagram of a memory device along a vertical direction of a bit line structure after forming a conducting layer structure according to an embodiment.
Figure 9:
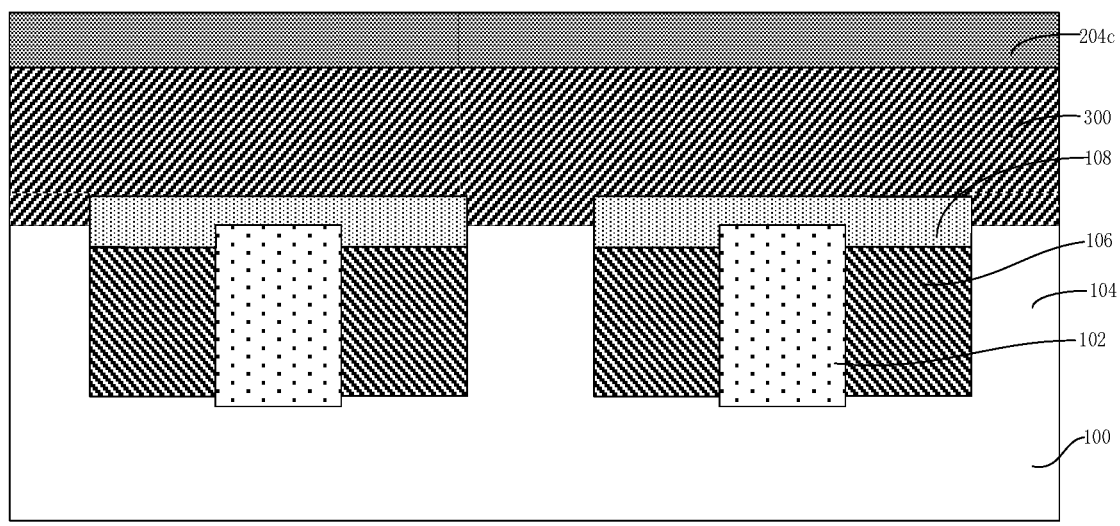
FIG. 9 is a side view of a corresponding memory device in FIG. 8 along a parallel direction of a bit line structure.

Referring to FIG. 5, which is a flow schematic diagram of S104 according to an embodiment. Referring to FIG. 6, which 6 is a sectional schematic diagram of a memory device along a vertical direction of a bit line structure after forming a conducting material layer according to an embodiment. Referring to FIG. 7, which is a side view of a corresponding memory device in FIG. 6 along a parallel direction of a bit line structure. Referring to FIG. 8, which is a sectional schematic diagram of a memory device along a vertical direction of a bit line structure after forming a conducting layer structure according to an embodiment. Referring to FIG. 9, which is a side view of a corresponding memory device in FIG. 8 along a parallel direction of a bit line structure.

As shown in FIG. 5, in an embodiment, S104 includes the following operation.

At S202, conducting material layers, of which upper surfaces are flush with those of bit line structures, are formed on a substrate.

Specifically, as shown in FIG. 6 and FIG. 7, firstly, conducting materials, of which upper surfaces are flush with those of the bit line structures 200, are formed on the substrate 100, and the conducting materials fill in trenches between adjacent bit line structures 200. Secondly, the conducting materials are subjected to chemical mechanical polishing (CMP), namely thinning treatment, so as to obtain the conducting material layers 302. Herein, the upper surfaces of the conducting material layers 302 are higher than those of the bit line structures 200 or flush with those of the bit line structures 200.

At S204, the conducting material layers are subjected to etching-back treatment to obtain conducting layer structures.

As shown in FIG. 8 and FIG. 9, the conducting material layers 302 are subjected to etching-back treatment to obtain conducting layer structures 300 of which the thicknesses are equal to a preset value. Herein, the preset value refers to a preset thickness value of the capacitor contact structure, and the upper surfaces of the conducting layer structures 300 are lower than those of the bit line structures 200.

As shown in FIG. 2 and FIG. 6 through FIG. 9, in one of the embodiments, an insulating layer 108 is formed on an upper surface of an active region 104. The operation that before the conducting layer structures 300 are formed between adjacent bit line structures 200 (namely, the conducting material layers 302 are formed between adjacent bit line structures 200) further includes a step of removing the insulating layer 108 on the upper surface of the active region 104 between adjacent bit line structures 200 so as to expose the active region 104, and the conducting layer structures 300 are in contact with the active regions 104. A conducting layer structures 300 formed between two adjacent bit line structures 200 includes a part in contact with the active region 104 that is later configured to form the capacitor contact structure. Compared with the process of etching a capacitor contact hole to exposes an active region at the bottom and filling the capacitor contact hole with a conducting material as the capacitor contact structure, in the present disclosure, first of all, the active region 104 in a preset region of the capacitor contact structure is exposed through etching the insulating layer 108 on the supper surface of the active region 104 in the trench between adjacent bit line structures 200. In the present disclosure, the conducting layer structures fill the trenches, thus there is not a problem caused by filing the upper-narrow and lower-wide capacitor contact hole when forming the inverted trapezoidal isolation structure by filling. Therefore, the problem that gaps occur in the capacitor contact structure is effectively avoided, and an alignment problem caused by overlay (OVL) errors of a preset direction of the capacitor contact structure vertical to the bit line structure and the active region is also effectively avoided. In the etching process for exposing the active region 104, the trenches are formed by etching, the widths of the trenches are greater than the widths of the hole, the depth is smaller, the etching loading is reduced, filling the contact hole is changed to fill the trench, and thus the filling difficulty is greatly reduced.

In an embodiment, after S104, the embodiment further includes that an insulating protection layer (not shown in the figure) is formed on a substrate 100, for example, an SIN insulation layer. The insulating protection layer covers on top surfaces and sidewalls of bit line structures 200 as well as the substrate between adjacent bit line structures 200, and an insulating layer 108 on the upper surface of the active region 104 between adjacent bit line structures 200 includes the insulating protection layer.

Figure 10:
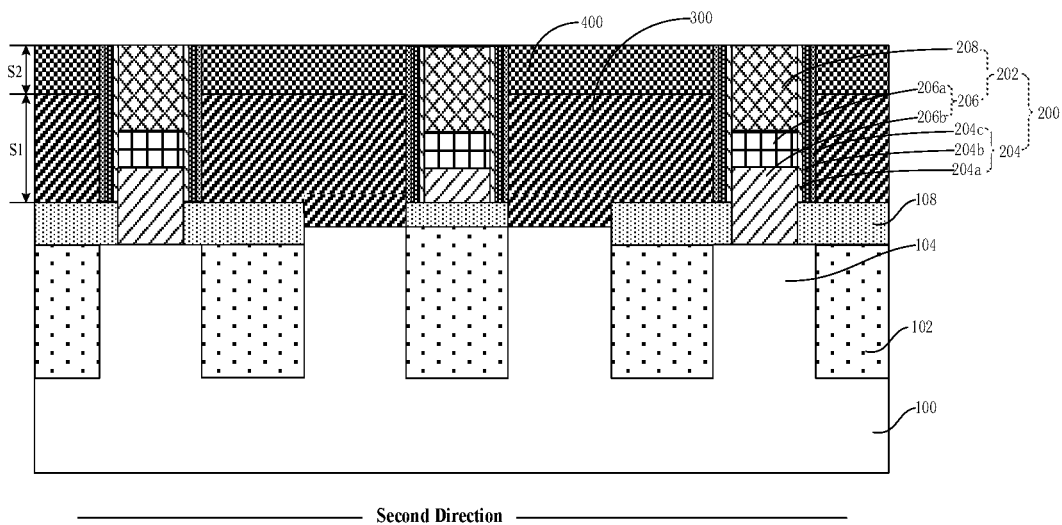
FIG. 10 is a sectional schematic diagram of a memory device along a vertical direction of a bit line structure after forming a sacrificial layer according to an embodiment.
Figure 11:
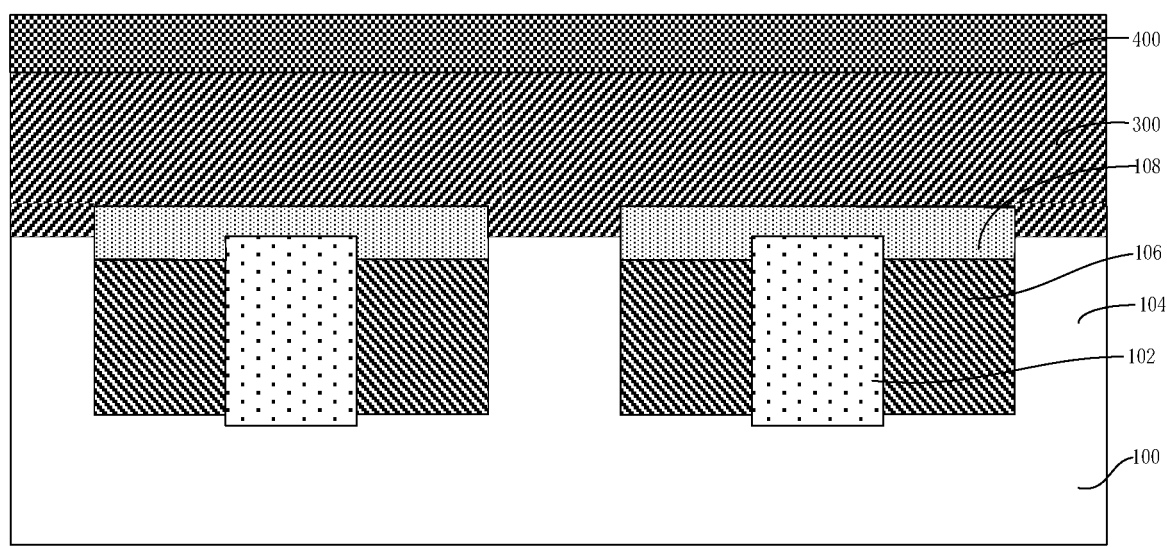
FIG. 11 is a side view of a corresponding memory device in FIG. 10 along a parallel direction of a bit line structure.

Referring to FIG. 10, which is a sectional schematic diagram of a memory device along a vertical direction of a bit line structure after forming a sacrificial layer according to an embodiment. Referring to FIG. 11, which is a side view of a corresponding memory device in FIG. 9 along a parallel direction of a bit line structure.

In an embodiment, conducting layer structures include polysilicon structures, and sacrificial layers include SOD layers.

As shown in FIG. 10 and FIG. 11, the sacrificial layers 400 are formed on the conducting layer structures 300. Specifically, after SOD material layers (sacrificial material layers) with upper surfaces higher than the bit line structures 200 are formed by spin-on the polysilicon structures, the SOD material layers are subjected to CMP, so as to obtain SOD layers (sacrificial layers 400) with flat surfaces.

In an embodiment, upper surfaces of the sacrificial layers 400 are flush with those of the bit line structures 200.

Figure 12:
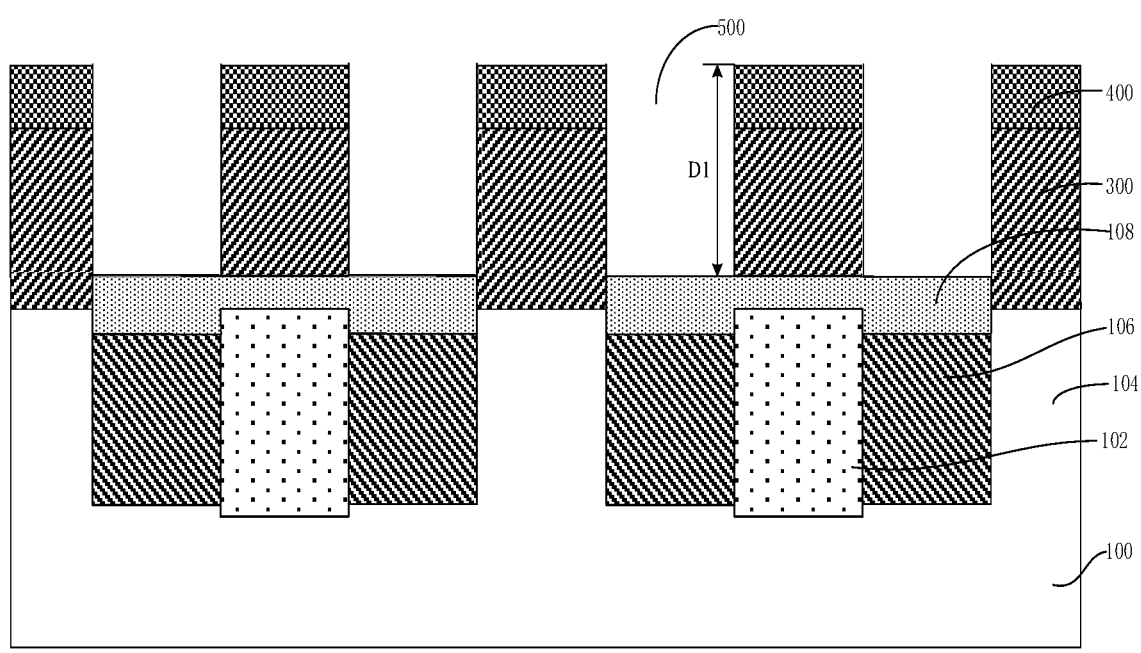
FIG. 12 is a sectional schematic diagram of a memory device along a parallel direction of a bit line structure after forming an isolation trench according to an embodiment.

Referring to FIG. 12, which is a sectional schematic diagram of a memory device along a parallel direction of a bit line structure after forming an isolation trench according to an embodiment. The corresponding sectional schematic diagram along a vertical direction of the bit line structure is similar to FIG. 10.

As shown in FIG. 12, firstly, mask patterns are formed on the sacrificial layers 400. The mask patterns expose the sacrificial layers 400 between adjacent bit line structures 200 and the two adjacent capacitor contact structure preset regions. The sacrificial layers 400 exposed by the mask patterns are subjected to an etching process, a plurality of isolation trenches 500 arranged in parallel and at intervals is formed in the sacrificial layers 400, and the isolation trenches 500 pass through the bit line structures 200 and extend along the second direction that intersects the first direction. After the conducting material layers are subjected to etching-back treatment, the conducting layer structures 300 are obtained, and then the sacrificial layers 400 are formed on the conducting layer structures 300. Finally, the isolation trenches 500 for filling the formed isolation dielectric layers are formed in the sacrificial layers. In the present disclosure, the isolation trenches 500 are formed by etching the sacrificial layers 400 and the conducting layer structures 300 below the sacrificial layers, so the traditional process for etching the sacrificial layers 400 (SOD) can be effectively compatible, and problems of profile bowing caused by fully etching the conducting layer structures 300, Si by-product appearing when the conducting layer structures 300 are polysilicon structures, not easily improving an etching selection ratio of polysilicon pair bit line structures (top layer dielectric layer silicon nitride) and more etching bit line structures are avoided.

In an embodiment, the isolation trenches 500 pass through all bit line structures 200.

As shown in FIG. 2, FIG. 10 and FIG. 12, in an embodiment, the bit line structures 200 include stacked structures 202 and sidewall structures 204. The stacked structures 202 include main conducting layers 206 and top dielectric layer 208 that are stacked, and the sidewall structures 204 are located at sidewalls of the stacked structures 202. The depth that the isolation trenches 500 are located right above the bit line structures 200 are less than a height of the top dielectric layer 208; the depth of the isolation trenches 500 that are between adjacent bit line structures 200 is equal to the sum of the thicknesses of the sacrificial layers 400 and the conducting layer structures 300, that is, parts of the isolation trenches 500 located between adjacent bit line structures 200 expose the insulating layer 108 at the bottom. At this time, the remaining conducting layer structures 300 in contact with the active region 104 are the capacitor contact structures.

Figure 13:
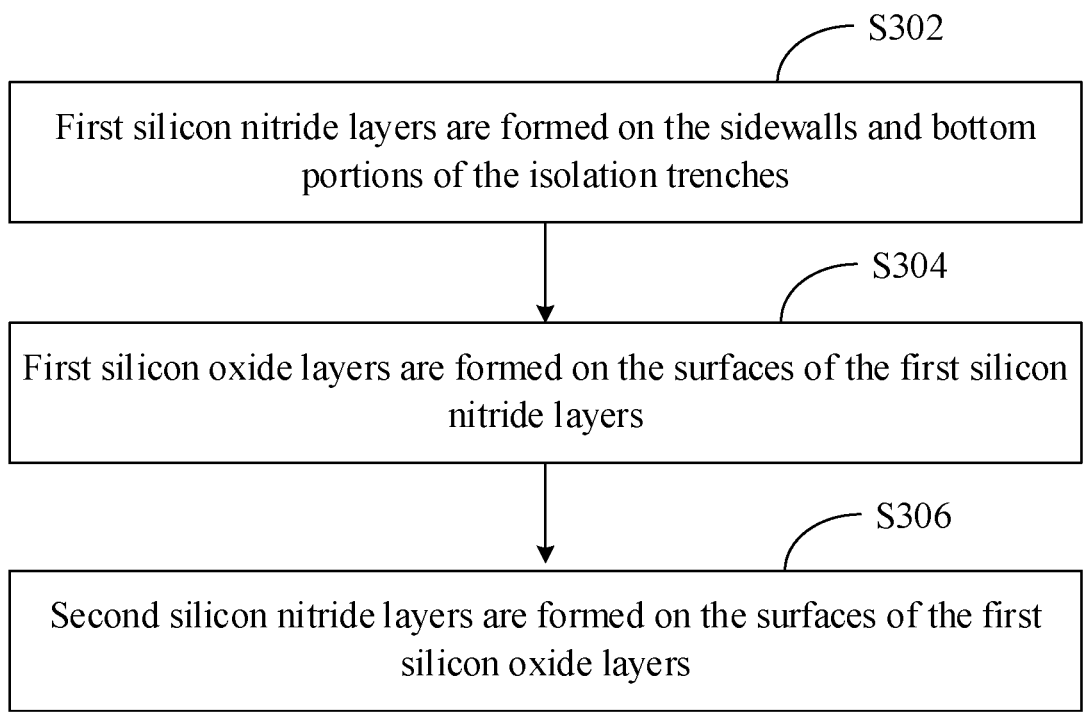
FIG. 13 is a flow schematic diagram for forming an isolation dielectric layer in an isolation trench according to an embodiment.
Figure 14:
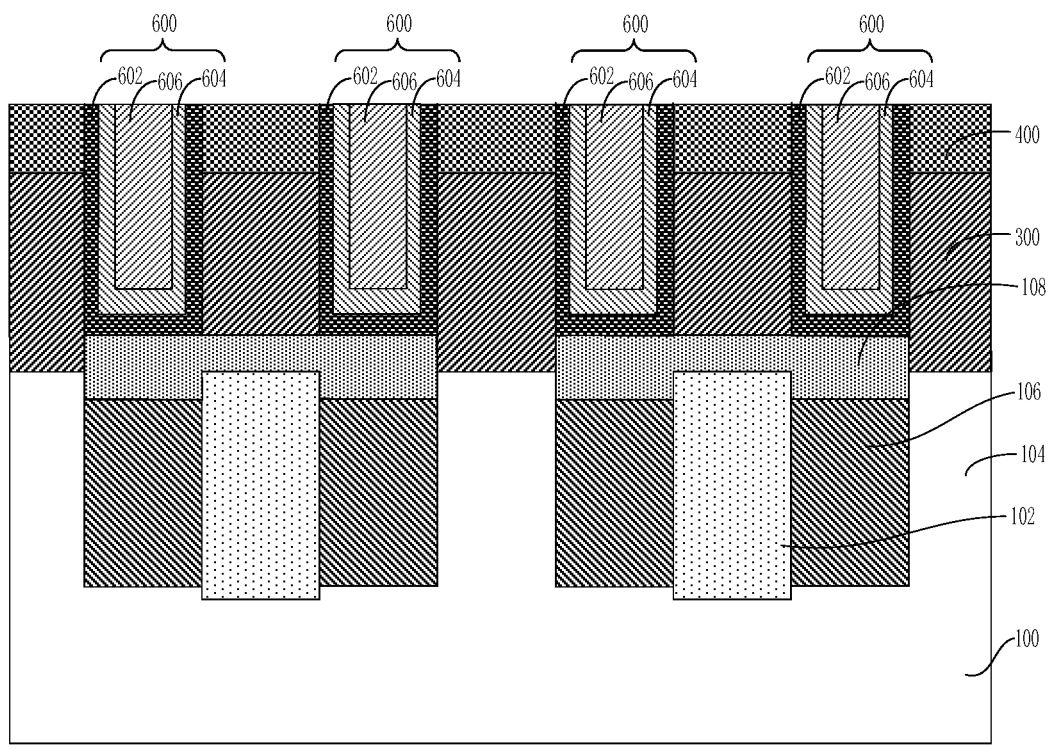
FIG. 14 is a sectional schematic diagram of a memory device along a parallel direction of a bit line structure after forming an isolation dielectric layer according to an embodiment.

Referring to FIG. 13, it is a flow schematic diagram for forming an isolation dielectric layer in an isolation trench according to an embodiment. Referring to FIG. 14, it is a sectional schematic diagram of a memory device along a parallel direction of a bit line structure after forming an isolation dielectric layer according to an embodiment. The corresponding sectional schematic diagram along a vertical direction of the bit line structure is similar to FIG. 10.

As shown in FIG. 13, in an embodiment, the isolation dielectric layers 600 formed in the isolation trenches have a NON structures (Nitride-oxide-nitride), including first silicon nitride layers 602, first silicon oxide layers 604 and second silicon nitride layers 606 which are formed in sequence from the substrate 100. Forming the isolation dielectric layers 600 in the isolation trenches 500 includes the following operations.

At S302, first silicon nitride layers are formed on the sidewalls and bottom portions of the isolation trenches.

At S304, first silicon oxide layers are formed on the surfaces of the first silicon nitride layers.

At S306, second silicon nitride layers are formed on the surfaces of the first silicon oxide layers.

Specifically, as shown FIG. 14, with a filming forming process well-known to those skilled in the art, firstly, the first silicon nitride layers 602 are formed on the sidewalls and bottom portions of the isolation trenches 500, secondly, the first silicon oxide layers 604 are formed on the surfaces of the first silicon nitride layers 602, and then the second silicon nitride layers 606 are formed on the surfaces of the first silicon oxide layers 604, and the second silicon nitride layers 606 fill all or part of the isolation trenches 500. So far, the isolation dielectric layers 600 are completed, and the capacitor contact structures between adjacent bit line structures 200 are isolated through the isolation dielectric layers 600. At the same time, the first silicon oxide layers 604 can effectively present a subsequently formed metal structure (tungsten metal) and a polysilicon structure from diffusing.

In an embodiment, the second silicon nitride layers 606 fill in the isolation trenches 500 and cover the sacrificial layers 400 and the upper surfaces of the bit line structures 200. Before S112, this embodiment further includes the following operation.

The second silicon nitride layers 606 on the upper surfaces of the sacrificial layers 400 are removed through a dry etch process or a wet etch process.

Figure 15:
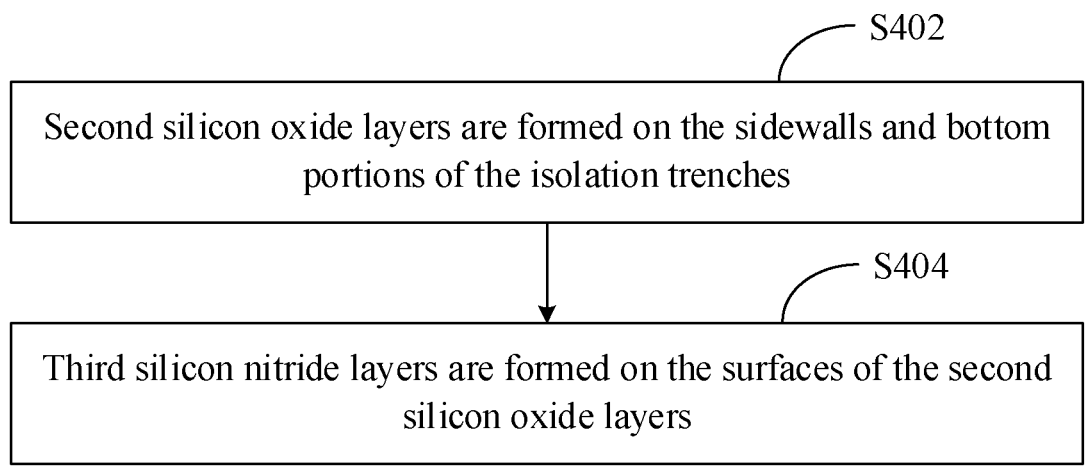
FIG. 15 is a flow schematic diagram for forming an isolation dielectric layer in an isolation trench according to another embodiment.

Referring to FIG. 15, which is a flow schematic diagram for forming an isolation dielectric layer in an isolation trench according to another embodiment.

As shown in FIG. 15, in another embodiment, the operation that the isolation dielectric layers 600 formed in the isolation trenches are oxide-nitride (ON) structures, including second silicon oxide layers and third silicon nitride layers that are successively formed from the substrate 100, are formed in the isolation trenches 500 includes the following operations.

At S402, second silicon oxide layers are formed on the sidewalls and bottom portions of the isolation trenches.

At S404, third silicon nitride layers are formed on the surfaces of the second silicon oxide layers.

Specifically, firstly, the second silicon oxide layers are formed on the sidewalls and bottom portions of the isolation trenches 500, secondly, the third silicon nitride layers are formed on the surfaces of the second silicon oxide layers, and the third silicon nitride layers fill all or part of the isolation trenches 500. So far, the isolation dielectric layers 600 are completed, and the capacitor contact structures between adjacent bit line structures 200 are isolated through the isolation dielectric layers 600.

In an embodiment, the third silicon nitride layers fill in the isolation trenches 500 and cover the sacrificial layers 400 and the upper surfaces of the bit line structures 200. Before S112, this embodiment further includes the following operation.

The third silicon nitride layers on the upper surfaces of the sacrificial layers 400 are removed through a dry etch process or a wet etch process.

Figure 16:
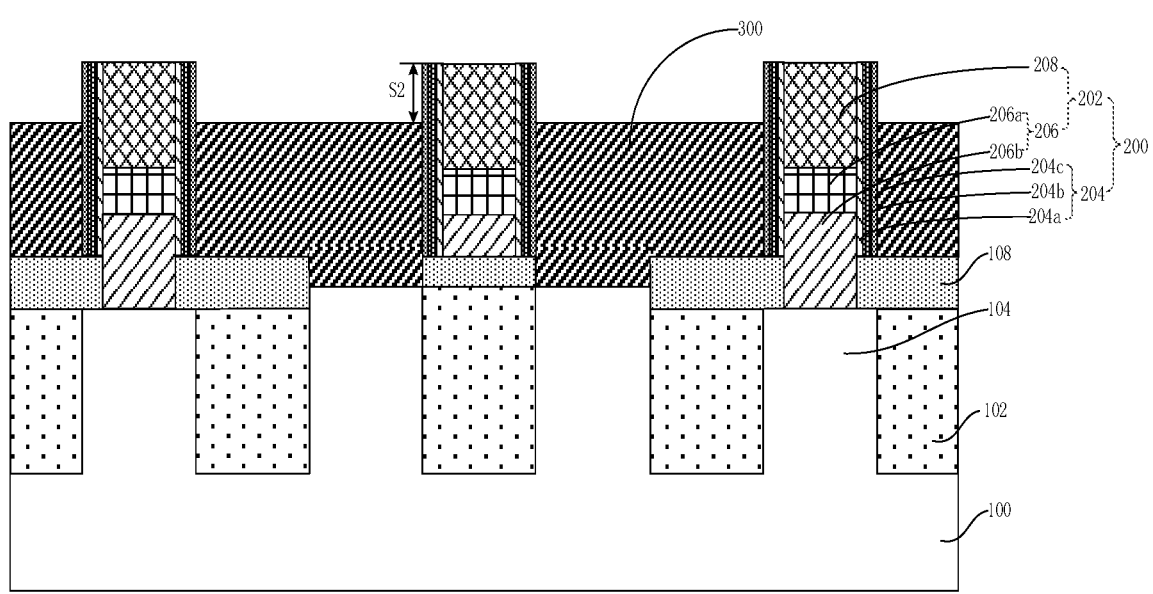
FIG. 16 is a sectional schematic diagram of a memory device along a vertical direction of a bit line structure after removing a sacrificial layer according to an embodiment.
Figure 17:
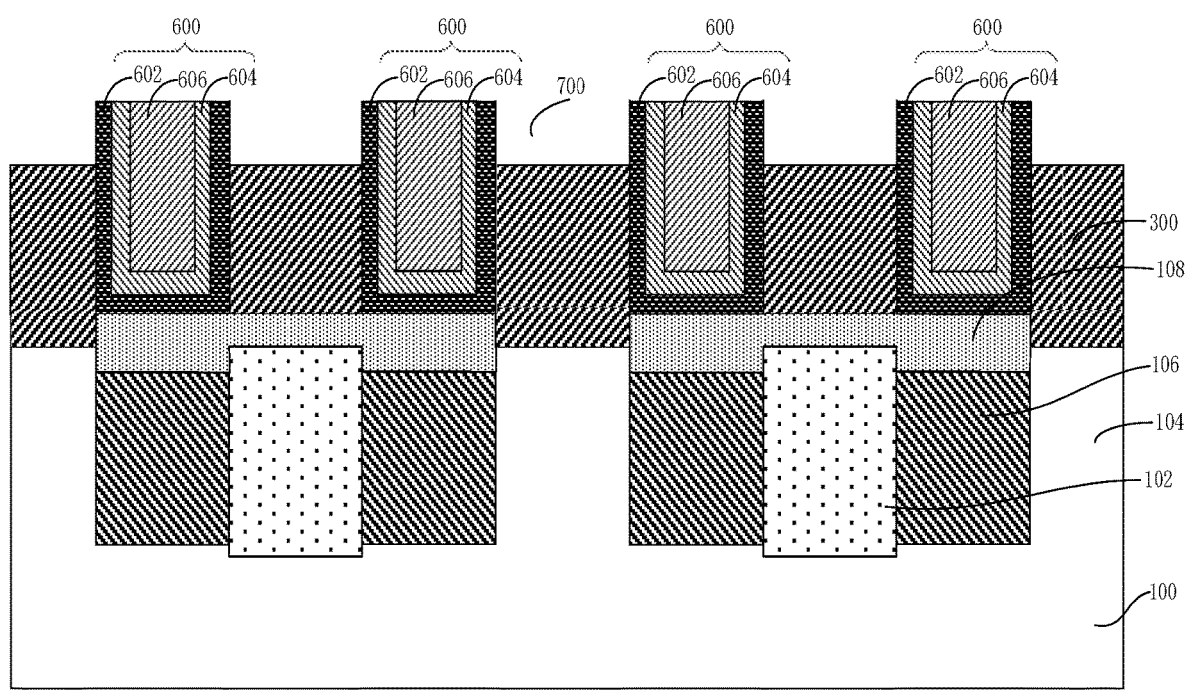
FIG. 17 is a side view of a corresponding memory device in FIG. 16 along a parallel direction of a bit line structure.
Figure 18:
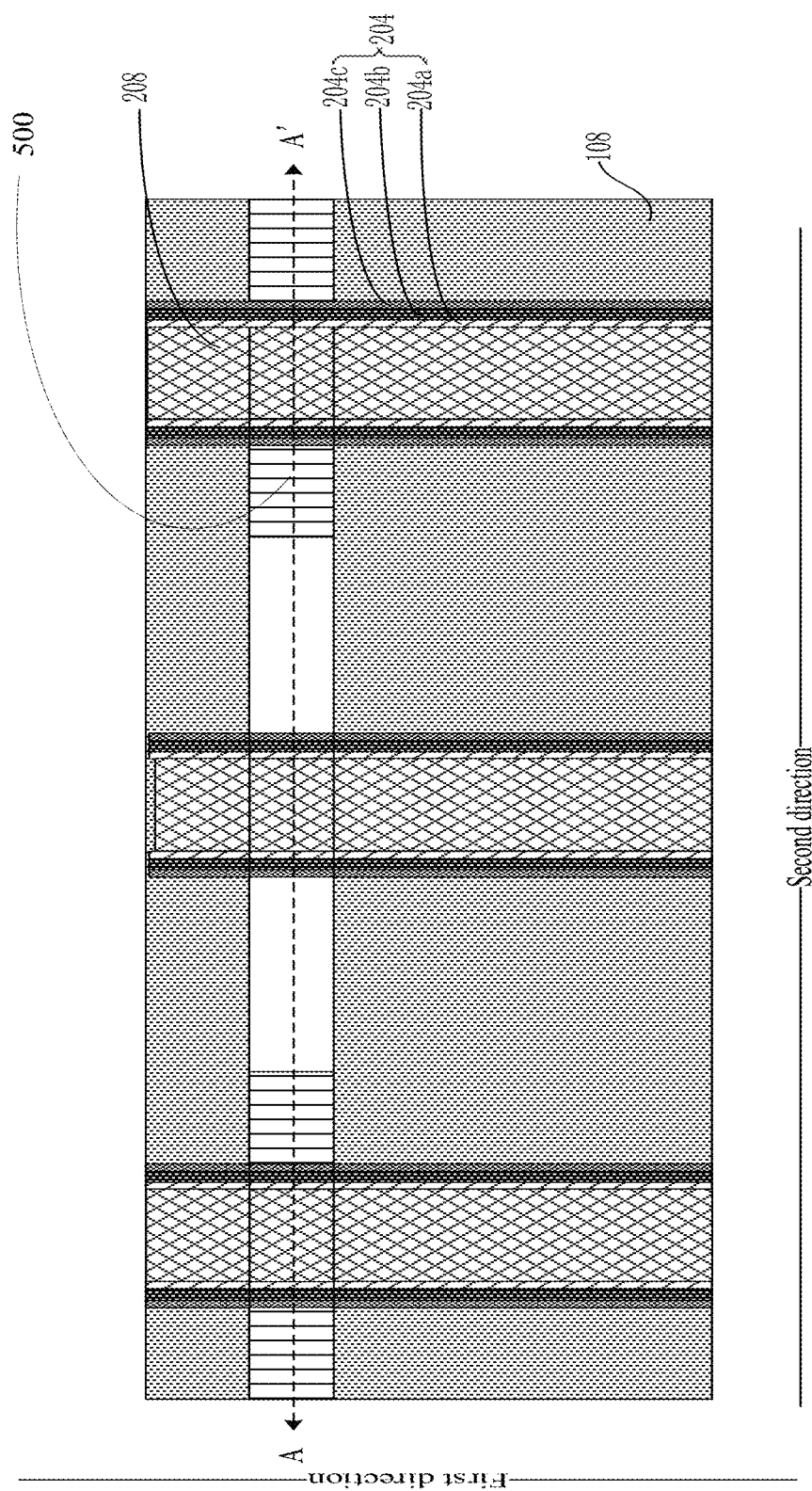
FIG. 18 is a top view of a memory device after forming the isolation trenches according to an embodiment.
Figure 19:
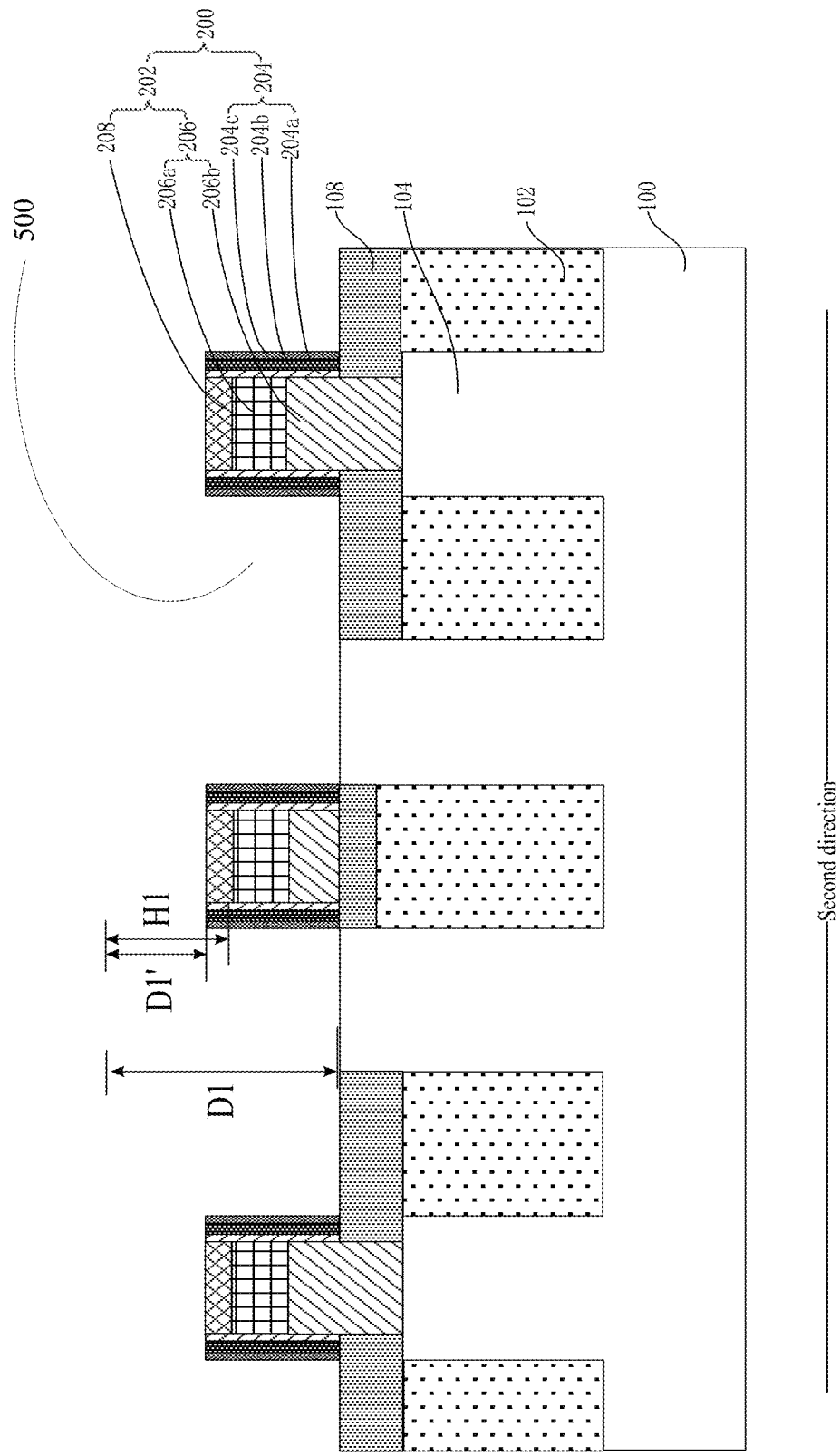
FIG. 19 is a side view of a corresponding memory device in FIG. 18 along line AA'.
Figure 20:
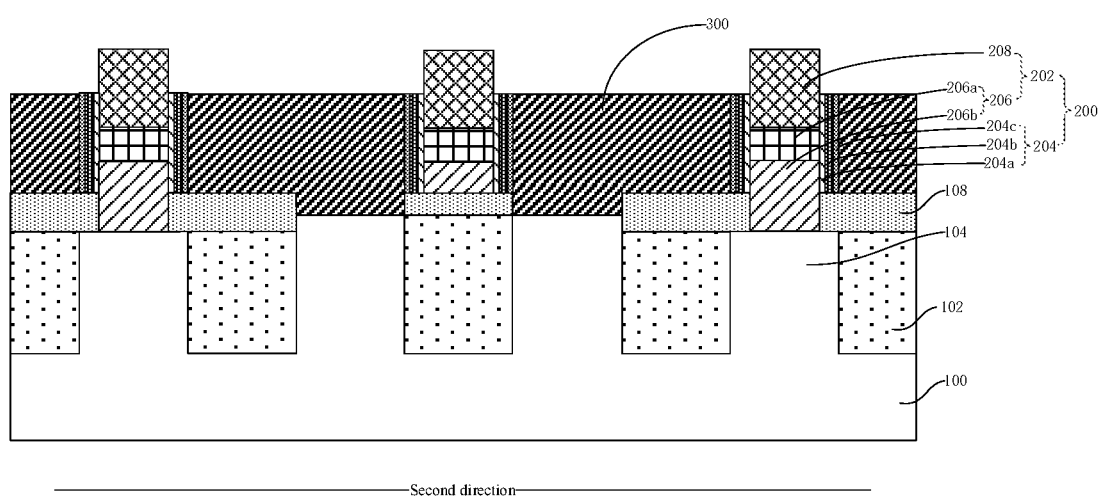
FIG. 20 is a side view of a corresponding memory device after removing the outer silicon nitride layer and the middle silicon oxide layer of the sidewall structures located above the conducting layer structures according to an embodiment.

Referring to FIG. 16, which is a sectional schematic diagram of a memory device along a vertical direction of a bit line structure after removing a sacrificial layer according to an embodiment. Referring to FIG. 17, which is a side view of a corresponding memory device in FIG. 15 along a parallel direction of a bit line structure.

As shown in FIG. 16, in an embodiment, the sidewall structure 204 is a stacked sidewall structure 204 including an inner silicon nitride layer 204a, a middle silicon oxide layer 204b and an outer silicon nitride layer 204c that are successively stacked from inside to outside. After the sacrificial layers 400 are removed by a self-alignment process, the operation further includes: the outer silicon nitride layer 204c and the middle silicon oxide layer 204b of the sidewall structures 204 located above the conducting layer structures 300 are removed, so that the upper surfaces of the outer silicon nitride layer 204c and the middle silicon oxide layer 204b flush with the upper surfaces of the bit line structures 200 are changed to be flush with the upper surfaces of the conducting layer structures 300.

In an embodiment, the sacrificial layers 400 are removed by a wet etch process.

In an embodiment, the etching solution of the wet etch process includes hydrofluoric acid and deionized water, and the molar ratio of hydrofluoric acid to the deionized water in the etching solution is 10:1-300:1. Specifically, during a process of removing the sacrificial layers 400, the wet etch process is firstly performed through the etching solution in which the molar ratio of hydrofluoric acid to the deionized water is 10:1-100:1, and then the molar ratio of hydrofluoric acid to the deionized water in the etching solution is adjusted according to the thickness of the remaining sacrificial layers 400.

In an embodiment, the present disclosure further provides a memory device capacitor contact structure, which is prepared through the abovementioned preparation method.

In an embodiment, the present disclosure further provides a memory device, including a memory device capacitor contact structure that is prepared through the abovementioned preparation method.

According to the abovementioned memory device capacitor contact structure, the conducting layer structures are formed between adjacent bit line structures, the sacrificial layers are formed on the conducting layer structures, the plurality of isolation trenches arranged in parallel and at intervals are formed in the sacrificial layers, the isolation trenches extend along the second direction, and the second direction intersects the first direction. The isolation dielectric layers are formed in the isolation trenches. The sacrificial layers are removed based on the bit line structures and the isolation dielectric layers, the grooves are formed between adjacent bit line structures and between adjacent isolation dielectric layers, and the grooves expose the conducting layer structures. Herein, the conducting layer structure exposed by the grooves and in contact with the active region are used as the capacitor contact structures. The capacitor contact structures in the present disclosure are a part of the conducting layer structures formed between adjacent bit line structures. Compared with the capacitor contact structure formed by filling the contact hole directly, these capacitor contact structures have less filling difficulty, and avoid the problem that gaps are formed in the capacitor contact structure, and then the contact between the capacitor structure formed above the capacitor contact structure and the active region is affected. Moreover, the sacrificial layers are formed on the conducting layer structures, when the capacitor contact structure is formed by etching, the sacrificial layers and the conducting layer structures are sequentially etched, which reduces the profile bowing and the deposition of Si by-product caused by completely etching the conducting layer structures, and solves the problem that it is difficult to increase the etching selection ratio of the conducting layer structures to the bit line structures.

Each technical feature of the abovementioned embodiments may be combined freely. For simplicity of description, not all possible combinations of each technical solution in the abovementioned embodiments are described. However, any combination of these technical features shall fall within the scope recorded in the specification without conflicting.

The abovementioned embodiments only express some implementation modes of the disclosure and are specifically described in detail and not thus understood as limits to the patent scope of the disclosure. It is to be pointed out that those of ordinary skill in the art may further make a plurality of transformations and improvements without departing from the concept of the disclosure and all of these falls within the scope of protection of the disclosure. Therefore, the scope of patent protection of the disclosure should be subject to the appended claims.

What is claimed is:

1. A method for preparing a capacitor contact structure of a memory device, comprising:
    providing a substrate, wherein a plurality of bit line structures arranged in parallel and at intervals are formed on the substrate, and the plurality of bit line structures extend along a first direction;
    forming a conducting layer structure between two adjacent ones of the plurality of bit line structures, wherein an upper surface of the conducting layer structure is lower than upper surfaces of the two adjacent ones of the plurality of bit line structures;
    forming a sacrificial layer on the conducting layer structure;
    forming a plurality of isolation trenches arranged in parallel and at intervals in the sacrificial layer and the conducting layer structure, wherein the plurality of isolation trenches extend along a second direction and pass through all the plurality of bit line structures, and the second direction intersects the first direction;
    forming isolation dielectric layers, each of the isolation dielectric layers is in each of the plurality of isolation trenches, wherein said forming the isolation dielectric layers comprises forming a first silicon nitride layer on sidewalls and bottom of each of the plurality of isolation trenches;
    forming a first silicon oxide layer on a surface of the first silicon nitride layer; and forming a second silicon nitride layer on a surface of the first silicon oxide layer; and
    removing the sacrificial layer based on the two adjacent ones of the plurality of bit line structures and the isolation dielectric layers to form grooves each between the two adjacent ones of the plurality of bit line structures and between two adjacent ones of the isolation dielectric layers, wherein the grooves expose the conducting layer structures.

2. The method of claim 1, wherein
    each of the plurality of bit line structures comprises a stacked structure and sidewall structures, the stacked structure comprises a main conducting layer and a top dielectric layer that are stacked, and the sidewall structures are located on sidewalls of the stacked structure; and
    a depth of the plurality of isolation trenches located directly above the plurality of bit line structures is less than a height of the top dielectric layer, a depth of each of the plurality of isolation trenches between the two adjacent ones of the plurality of bit line structures is equal to a sum of a thickness of the sacrificial layer and a thickness of the conducting layer structure.

3. The method of claim 2, wherein
    each of the sidewall structures is a stacked sidewall structure including an inner silicon nitride layer, a middle silicon oxide layer and an outer silicon nitride layer that are sequentially stacked from inside to outside; and
    after the sacrificial layers are removed, the method further comprises: removing the outer silicon nitride layer and the middle silicon oxide layer of the sidewall structures located above the conducting layer structure.

4. A capacitor contact structure of a memory device prepared with the method of claim 2.

5. The method of claim 1, wherein
    the conducting layer structure comprises a polysilicon structure, and the sacrificial layer comprises a Spin-on Dielectric (SOD) layer.

6. The method of claim 5, wherein
    the sacrificial layer is removed by a wet etch process.

7. The method of claim 6, wherein
    an etching solution of the wet etch process comprises hydrofluoric acid and deionized water, and a molar ratio of the hydrofluoric acid to the deionized water in the etching solution is 10:1-300:1.

8. A capacitor contact structure of a memory device prepared with the method of claim 5.

9. The method of claim 1, wherein said forming the second silicon nitride layer on the surface of the first silicon oxide layer comprises:
    forming the second silicon nitride layer filling up each of the plurality of isolation trenches and covering an upper surface of the sacrificial layer and the upper surfaces of the two adjacent ones of the plurality of bit line structures, and prior to removing the sacrificial layer;
    removing the second silicon nitride layer on the upper surface of the sacrificial layer and the upper surfaces of the two adjacent ones of the plurality of bit line structures by a dry etching process or a wet etching process.

10. A capacitor contact structure of a memory device prepared with the method of claim 9.

11. The method of claim 1, wherein said forming the isolation dielectric layers trenches comprises:
    forming a second silicon oxide layer on the sidewalls and the bottoms of each of the isolation trenches; and
    forming a third silicon nitride layer on the surface of the second silicon oxide layer.

12. The method of claim 1, wherein the first direction is orthogonal to the second direction.

13. The method of claim 1, wherein shallow trench isolation structures are formed in the substrate, and the shallow trench isolation structures isolate a plurality of active regions arranged at intervals in the substrate.

14. The method of claim 13, wherein
    an insulating layer is formed on upper surfaces of the active regions;
    before forming the conducting layer structure between the two adjacent ones of the plurality of bit line structures, the method further comprises removing the insulating layer on the upper surfaces of the active regions between the two adjacent ones of the plurality of bit line structures to expose the active regions; and the conducting layer structure is in contact with the active regions.

15. The method of claim 1, wherein a plurality of embedded gate word lines arranged in parallel and at intervals are formed in the substrate, and the plurality of embedded gate word lines extend along the second direction.

16. A capacitor contact structure of a memory device prepared with the method of claim 1.

* * * * *